(12) United States Patent
Han et al.

(10) Patent No.: US 9,219,206 B2
(45) Date of Patent: Dec. 22, 2015

(54) PACKAGE AND MANUFACTURING METHOD OF THE SAME

(75) Inventors: Young Ju Han, Seoul (KR); Deok Ki Hwang, Seoul (KR); Jae Chung Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 190 days.

(21) Appl. No.: 13/522,902

(22) PCT Filed: Dec. 23, 2010

(86) PCT No.: PCT/KR2010/009288
§ 371 (c)(1),
(2), (4) Date: Sep. 24, 2012

(87) PCT Pub. No.: WO2011/090269
PCT Pub. Date: Jul. 28, 2011

(65) Prior Publication Data
US 2013/0020109 A1    Jan. 24, 2013

(30) Foreign Application Priority Data

Jan. 19, 2010  (KR) .................. 10-2010-0004797
Mar. 17, 2010  (KR) .................. 10-2010-0023923

(51) Int. Cl.
*H05K 1/03*    (2006.01)
*H01L 33/62*   (2010.01)
(Continued)

(52) U.S. Cl.
CPC ............. *H01L 33/62* (2013.01); *H01L 33/0079* (2013.01); *H01L 33/44* (2013.01); *H01L 2924/0002* (2013.01); *H01L 2933/0066* (2013.01)

(58) Field of Classification Search
CPC ............. H05K 1/02; H05K 1/11; H05K 1/18; H05K 1/141; H05K 1/187; H05K 3/00; H05K 3/40; H05K 3/46; H05K 3/207; H05K 3/387; H05K 7/00; H05K 7/20; H01L 21/02; H01L 21/31; H01L 21/48; H01L 23/02; H01L 23/48; H01L 23/58

USPC ........... 174/255, 262; 361/702, 728, 783; 438/128, 637, 758; 428/209; 422/122; 29/852; 257/98, 629, 686
See application file for complete search history.

(56) References Cited

U.S. PATENT DOCUMENTS 5,140,450 A * 8/1992 Nikaido .................. 349/158
5,882,806 A * 3/1999 Mori ...................... 428/690
(Continued)

FOREIGN PATENT DOCUMENTS

JP    2000-244012    9/2000
JP    2001-148509    5/2001
(Continued)

OTHER PUBLICATIONS

International Search Report in International Application No. PCT/KR2010/009288, filed Dec. 23, 2010.
(Continued)

*Primary Examiner* — Xiaoliang Chen
(74) *Attorney, Agent, or Firm* — Saliwanchik, Lloyd & Eisenschenk

(57) ABSTRACT

Provided are a package including a first conductive layer on a patterned layer, an insulating layer on the patterned layer burying the first conductive layer, a second conductive layer on an outer surface of the insulating layer, and a third conductive layer in the insulating layer electrically connecting the first conductive layer with the second conductive layer. A substrate is formed by printing or coating a paste- or ink-type insulator and conductor on a patterned layer formed on a sapphire wafer. No void is created between the substrate and LED chip, thus enhancing attachment strength. The ceramic-containing insulator is cured at a low temperature, thereby minimizing contraction of and damage to the wafer when the ceramic is fired. Printing methods utilizing viscous paste or ink solves problems with co-planarity of substrate that occur in existing wafer-to-wafer bonding processes and renders several steps of the existing substrate manufacturing process unnecessary.

2 Claims, 2 Drawing Sheets

(51) Int. Cl.
*H01L 33/44* (2010.01)
*H01L 33/00* (2010.01)

(56) References Cited

U.S. PATENT DOCUMENTS

| | | | | |
|---|---|---|---|---|
| 6,054,219 A * | 4/2000 | Satsu et al. | | 428/403 |
| 6,331,450 B1 | 12/2001 | Uemura | | |
| 6,376,052 B1 * | 4/2002 | Asai et al. | | 428/209 |
| 6,835,112 B2 * | 12/2004 | Tanabe et al. | | 445/50 |
| 7,145,289 B2 * | 12/2006 | Yamazaki et al. | | 313/506 |
| 7,514,772 B2 * | 4/2009 | Kobayashi et al. | | 257/686 |
| 7,541,733 B2 * | 6/2009 | Ueno et al. | | 313/502 |
| 7,825,422 B2 | 11/2010 | Maeda et al. | | |
| 7,906,788 B2 * | 3/2011 | Nagai | | 257/88 |
| 8,062,085 B2 * | 11/2011 | Matsuda | | 445/2 |
| 8,164,166 B2 * | 4/2012 | Imada et al. | | 257/629 |
| 8,471,283 B2 * | 6/2013 | Ishii et al. | | 257/98 |
| 2002/0030288 A1 * | 3/2002 | Hashimoto | | 257/784 |
| 2002/0031688 A1 * | 3/2002 | Tanabe et al. | | 428/917 |
| 2002/0159242 A1 * | 10/2002 | Nakatani et al. | | 361/760 |
| 2003/0189829 A1 * | 10/2003 | Shimizu et al. | | 362/240 |
| 2004/0040740 A1 * | 3/2004 | Nakatani et al. | | 174/256 |
| 2004/0078969 A1 * | 4/2004 | Kanzawa et al. | | 29/852 |
| 2004/0214427 A1 * | 10/2004 | Kloster et al. | | 438/637 |
| 2005/0039948 A1 * | 2/2005 | Asai et al. | | 174/262 |
| 2005/0077531 A1 * | 4/2005 | Kim | | 257/98 |
| 2005/0118750 A1 * | 6/2005 | Baba et al. | | 438/128 |
| 2005/0200029 A1 * | 9/2005 | Hashimoto | | 257/781 |
| 2005/0207165 A1 * | 9/2005 | Shimizu et al. | | 362/362 |
| 2005/0237747 A1 * | 10/2005 | Shimizu et al. | | 362/294 |
| 2005/0242362 A1 * | 11/2005 | Shimizu et al. | | 257/99 |
| 2006/0043402 A1 * | 3/2006 | Suehiro et al. | | 257/99 |
| 2006/0043407 A1 * | 3/2006 | Okazaki | | 257/100 |
| 2006/0102915 A1 * | 5/2006 | Kim | | 257/98 |
| 2006/0125117 A1 * | 6/2006 | Hashimoto | | 257/781 |
| 2006/0160409 A1 * | 7/2006 | Shimizu et al. | | 439/490 |
| 2006/0231853 A1 * | 10/2006 | Tanaka et al. | | 257/99 |
| 2006/0238115 A1 * | 10/2006 | Lee et al. | | 313/504 |
| 2007/0187708 A1 * | 8/2007 | Setomoto et al. | | 257/99 |
| 2007/0228947 A1 * | 10/2007 | Tanimoto et al. | | 313/506 |
| 2007/0232075 A1 * | 10/2007 | Imada et al. | | 438/758 |
| 2007/0296088 A1 * | 12/2007 | Hashimoto | | 257/781 |
| 2008/0017860 A1 * | 1/2008 | Kubota et al. | | 257/59 |
| 2008/0023713 A1 * | 1/2008 | Maeda et al. | | 257/98 |
| 2008/0035935 A1 * | 2/2008 | Shum | | 257/79 |
| 2008/0036362 A1 * | 2/2008 | Tanimoto et al. | | 313/498 |
| 2008/0123302 A1 * | 5/2008 | Kawano et al. | | 361/728 |
| 2008/0174494 A1 * | 7/2008 | Suzuki et al. | | 343/700 MS |
| 2008/0191620 A1 * | 8/2008 | Moriyama et al. | | 313/506 |
| 2008/0210930 A1 * | 9/2008 | Kamatani et al. | | 257/40 |
| 2008/0251792 A1 * | 10/2008 | Murakami et al. | | 257/72 |
| 2008/0252212 A1 * | 10/2008 | Suehiro et al. | | 313/512 |
| 2008/0274018 A1 * | 11/2008 | Kawai et al. | | 422/122 |
| 2008/0277148 A1 * | 11/2008 | Asai et al. | | 174/255 |
| 2008/0303411 A1 * | 12/2008 | Ohta et al. | | 313/503 |
| 2008/0304237 A1 * | 12/2008 | Shiraishi | | 361/702 |
| 2008/0305587 A1 * | 12/2008 | Hashimoto | | 438/127 |
| 2009/0001869 A1 * | 1/2009 | Tanimoto et al. | | 313/502 |
| 2009/0008654 A1 * | 1/2009 | Nagai | | 257/88 |
| 2009/0101929 A1 | 4/2009 | Mo et al. | | |
| 2009/0166664 A1 | 7/2009 | Park et al. | | |
| 2009/0186431 A1 * | 7/2009 | Tanaka et al. | | 438/22 |
| 2009/0224278 A1 * | 9/2009 | Nagai | | 257/99 |
| 2010/0118017 A1 * | 5/2010 | Yamashita et al. | | 345/211 |
| 2010/0187556 A1 | 7/2010 | Kim et al. | | |
| 2010/0258830 A1 * | 10/2010 | Ide et al. | | 257/98 |
| 2011/0006334 A1 * | 1/2011 | Ishii et al. | | 257/98 |
| 2011/0019381 A1 * | 1/2011 | Kawano et al. | | 361/783 |
| 2011/0101399 A1 | 5/2011 | Suehiro et al. | | |
| 2011/0272731 A1 * | 11/2011 | Suzuki et al. | | 257/99 |
| 2011/0284914 A1 * | 11/2011 | Suzuki et al. | | 257/99 |
| 2011/0291143 A1 * | 12/2011 | Kim et al. | | 257/98 |
| 2011/0311831 A1 * | 12/2011 | Suzuki et al. | | 428/457 |

FOREIGN PATENT DOCUMENTS

| | | |
|---|---|---|
| JP | 2002-317048 | 10/2002 |
| JP | 2003-224305 | 8/2003 |
| JP | 2005-051184 | 2/2005 |
| JP | 2006-100787 | 4/2006 |
| JP | 2006-114820 | 4/2006 |
| JP | 2006-287020 | 10/2006 |
| JP | 2006-287032 | 10/2006 |
| JP | 2007-180525 | 7/2007 |
| JP | 2008-130723 A | 6/2008 |
| JP | 2008-140873 | 6/2008 |
| JP | 2008-205453 | 9/2008 |
| JP | 2009-032828 | 2/2009 |
| JP | 2009-123829 | 6/2009 |
| KR | 10-2002-0057670 A | 7/2002 |
| KR | 10-2005-0116373 A | 12/2005 |
| KR | 10-2006-0020822 A | 3/2006 |
| KR | 10-0652133 B1 | 11/2006 |
| KR | 10-2007-0043989 A | 4/2007 |
| KR | 10-2008-0056925 A | 6/2008 |
| KR | 10-2009-0072941 A | 7/2009 |
| KR | 10-0990122 B1 | 10/2010 |
| KR | 10-2011-0018630 A | 2/2011 |
| WO | WO 2004/081140 A1 | 9/2004 |
| WO | WO-2005/029599 A2 | 3/2005 |
| WO | WO-2009/053916 A1 | 4/2009 |

OTHER PUBLICATIONS

European Search Report in European Application No. 10844065.2, dated Mar. 17, 2015.

* cited by examiner

[Fig. 1]
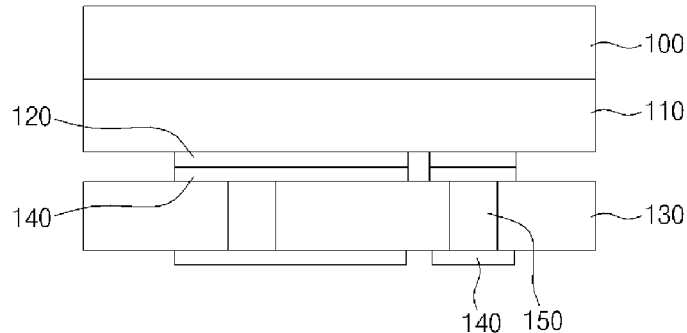
[Fig. 2]
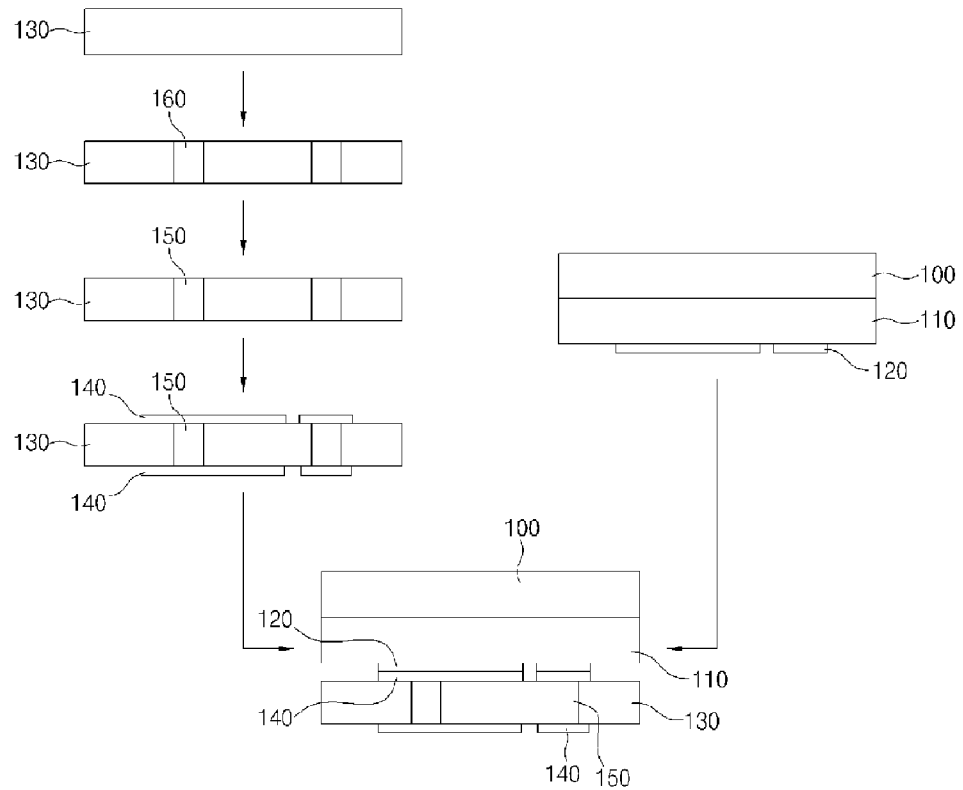
[Fig. 3]
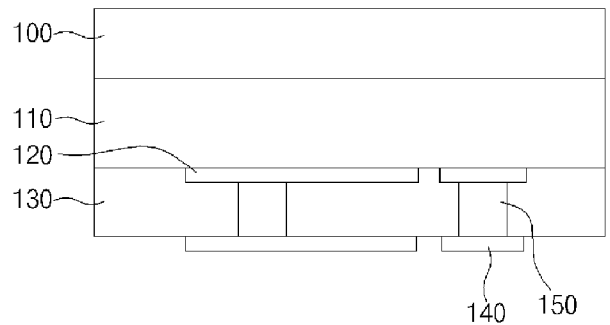

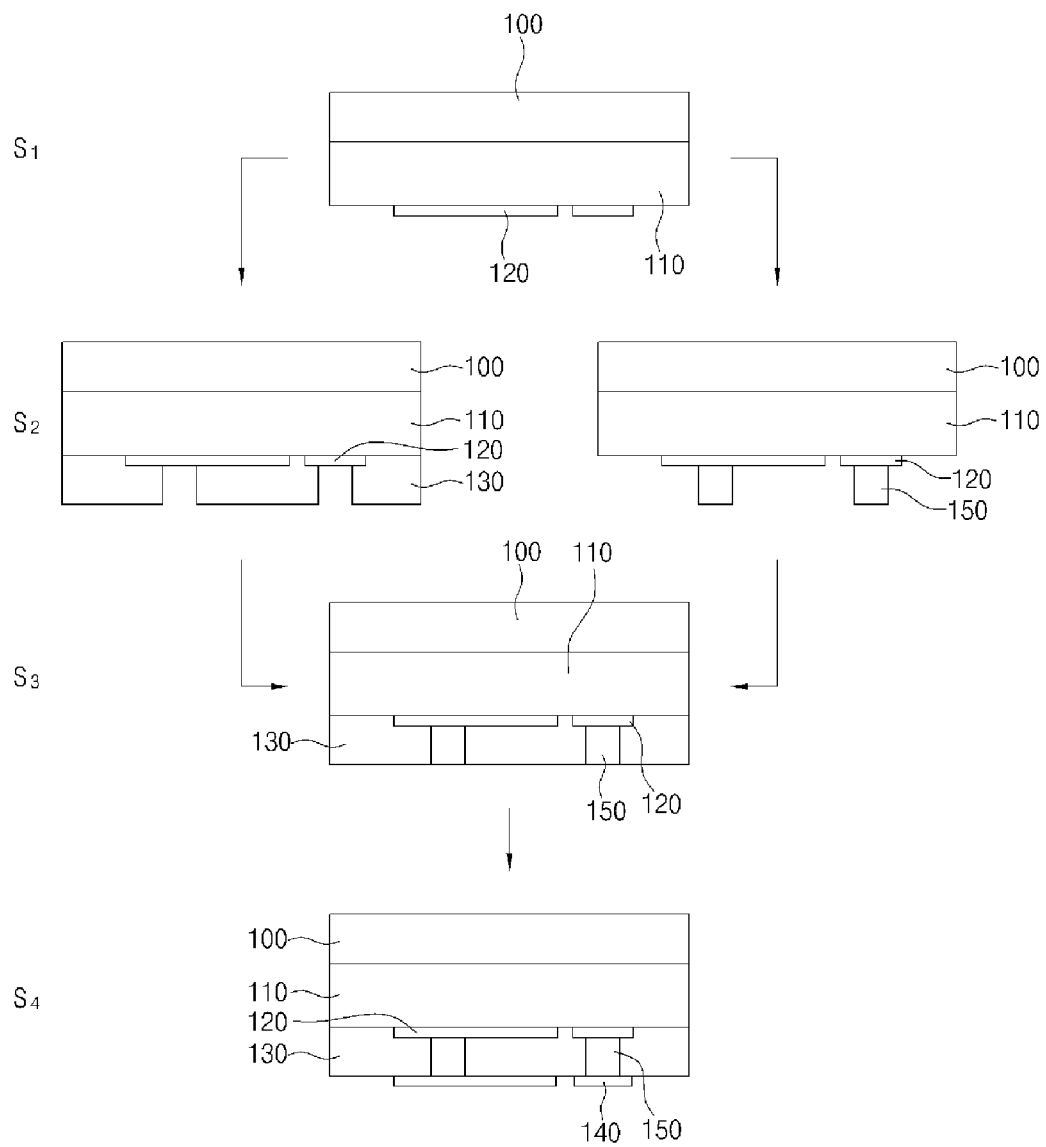
[Fig. 4]

PACKAGE AND MANUFACTURING METHOD OF THE SAME

CROSS-REFERENCE TO RELATED APPLICATIONS

This application is the U.S. national stage application of International Patent Application No. PCT/KR2010/009288, filed Dec. 23, 2010, which claims priority to Korean Patent Application Nos. 10-2010-0004797, filed Jan. 19, 2010, and 10-2010-0023923, filed Mar. 17, 2010, the disclosures of each of which are incorporated herein by reference in their entirety.

TECHNICAL FIELD

The present disclosure is directed to a package and a method of manufacturing the package. More specifically, the present disclosure is directed to a package that may enhance attachment capability since there is no void between a chip and an insulating layer and a method of manufacturing the package.

BACKGROUND ART

Light emitting diodes ("LEDs") emit light when forward biased. LEDs employ field effects as a light emitting principle. LEDs have an even longer life span than that of incandescent lamps. LEDs may emit various colors of light from ultraviolet rays through visible light up to infrared rays. The first visible LEDs were developed in 1962 by Nick Holonyak who was a professor at the University of Illinois. LEDs are currently used for various purposes and expected to replace fluorescent lamps or incandescent lamps in near future.

Like general semiconductor chips, an LED chip needs to be packaged to be mounted on a PCB ("Printed Circuit Board"). As LED packages are made smaller and thinner, there is an effort to save costs of process and investment by changing existing WL ("Wafer Level") to CS ("Chip Scale"). Accordingly, packaging is performed in a wafer-to-wafer bonding process differently from the existing packaging process that is performed by connecting lead frames with the chip through wire bonding or die bonding. By doing so, the number of steps required in a manufacturing process may be decreased and the number of packages per wafer may be increased.

FIG. 1 is a cross sectional view illustrating a package manufactured in a conventional wafer-to-wafer bonding method. Referring to FIG. 1, the package includes a sapphire substrate 100, a patterned layer 110 grown on the sapphire substrate 100, a conductive layer 120 (hereinafter, referred to as "first conductive layer") formed on the patterned layer 110, an insulating layer 130, a conductive layer 140 (hereinafter, referred to as "second conductive layer") formed on the insulating layer 130 and brought in contact with the first conductive layer 120, a conductive layer 150 (hereinafter, referred to as "third conductive layer") passing through the insulating layer 130 and electrically connecting the first conductive layer 120 with the second conductive layer 140. In the conventional package, since the first conductive layer 120 is brought in contact with the second conductive layer 140 upon the wafer-to-wafer bonding, a void is created between a chip and the insulating layer. Such a void may weaken attachment strength.

FIG. 2 is a view illustrating a process of manufacturing a package in a conventional wafer-to-wafer bonding method. Referring to FIG. 2, the insulating layer 130 is first prepared. The insulating layer 130 may be an Si layer, an AlN layer, or an $Al_2O_3$ layer. Thereafter, a via hole 160 is formed through the insulating layer and plated to form the third conductive layer 150. Then, the second conductive layer 140 is formed on the insulating layer 130 and the third conductive layer 150, and wafer-to-wafer bonded with a chip including the patterned layer 110 and the first conductive layer 120 sequentially formed on the sapphire substrate 100. In the conventional LED package and the method of manufacturing the LED package, the Si substrate has excellent flatness compared to other substrates, but has disadvantages of a long process time and a high material cost for substrate production. The ceramic substrate, such as AlN or LTCC substrate, has a lower material cost than that of other substrates, but has a relatively long process time and poor flatness. Further, as described above, there is a problem that a void occurs between the chip and the insulating layer. Accordingly, there is a need for a package that has a reduced process time and a high flatness while enhancing attachment strength and a method of manufacturing the package.

DISCLOSURE OF INVENTION

Technical Problem

Embodiments of the present invention provide a package that may shorten the process time, increase flatness (or bonding uniformity), and enhance attachment strength between the insulating layer and the chip.

Solution to Problem

According to an embodiment of the present invention, there is provided a package including a first conductive layer on a patterned layer, an insulating layer on the patterned layer to bury the first conductive layer, a second conductive layer on an outer surface of the insulating layer, and a third conductive layer in the insulating layer to electrically connect the first conductive layer with the second conductive layer.

The insulating layer may include a filler that contains at least one of Si, Al, AlN, $Al_2O_3$, BN and LTCC ("Low Temperature Cofiered Ceramics").

The insulating layer may include a filler, a resin, a dispersing agent, and an additive. The filler may include a phosphor. In the case where the phosphor is included in the filler, the amount of phosphor contained in a mold resin and an EMC ("Epoxy Mold Component") used for packing the chip together with a sealant may be reduced, thus solving technical problems with attaching properties of mold material or dispersibility of phosphor that may occur since the phosphor is high in content.

The filler or resin may be metal powder selected from Ag, W, Pt, and Pd, and epoxy resin, or ceramic powder using ion conductivity and selected from BaAl2O4 or ZnS and epoxy resin, or may contain at least one of Si, Al, AlN, BN, $Al_2O_3$, and LTCC ("Low Temperature Cofired Ceramics"). Accordingly, an ESD protection function may be embedded in the chip-sized package.

According to an embodiment of the present invention, there is provided a method of manufacturing a package including forming a patterned layer on a sapphire substrate, forming a first conductive layer on the patterned layer, forming at least one of an insulating layer and a third conductive layer on the patterned layer and the first conductive layer by a printing method using a paste or an ink to bury the first conductive layer, forming a second conductive layer on the third conductive layer to be electrically connected to the first conductive layer, and removing the sapphire substrate.

Burying the first conductive layer may be performed by sequentially or alternately printing a paste- or ink-type insulating material and a paste- or ink-type conductive material on the patterned layer and the first conductive layer, and curing the insulating material and the conductive layer to form the insulating layer and the third conductive layer.

Burying the first conductive layer may be performed by printing a paste- or ink-type insulating material on the patterned layer and the first conductive layer and curing the insulating material to form the insulating layer, and plating an inner portion of the insulating layer to form the third conductive layer.

Burying the first conductive layer may be performed by plating the third conductive layer on the first conductive layer and printing and curing a paste- or ink-type insulating material on the patterned layer and the first conductive layer to form the insulating layer.

Forming the second conductive layer may include printing a paste- or ink-type insulating material to form the second conductive layer. Removing the sapphire substrate is performed by a laser lift-off process.

The paste- or ink-type insulating material may include a filler, a resin, a solvent, a dispersing agent, and an additive, wherein the solvent is volatilized after curing.

The filler and resin, respectively, may be metal powder and epoxy resin, or ceramic powder using ion conductivity and epoxy resin.

Advantageous Effects of Invention

According to the embodiments of the present invention, a substrate may be formed by printing or coating a paste- or ink-type insulator and conductor on a patterned layer that is formed on a sapphire wafer. Thus, no void is created between the substrate and LED chip, thus enhancing attachment strength.

Further, since the insulator containing a ceramic component is cured at a low temperature, it may be possible to minimize contraction of the wafer that occurs when the ceramics is fired and resultant damage to the wafer. And, problems with co-planarity of substrate that are issued in the existing wafer-to-wafer bonding process may be solved thanks to a printing method utilizing paste or ink with viscosity.

Moreover, the package is produced by a printing method instead of the existing substrate manufacturing process and substrate attachment process and thus several steps may be unnecessary. Accordingly, it may be possible to shorten costs of material and process and manufacturing period. Further, the phosphor or ESD protection material contained in the insulator may enhance luminous efficiency or provide an antistatic feature.

BRIEF DESCRIPTION OF DRAWINGS

FIG. 1 is a cross sectional view illustrating a package manufactured in a conventional wafer-to-wafer bonding method;

FIG. 2 is a view illustrating a process of manufacturing a package in a conventional wafer-to-wafer bonding method;

FIG. 3 is a cross sectional view illustrating a package manufactured according to an embodiment of the present invention; and FIG. 4 is a view illustrating a process of manufacturing a package according to an embodiment of the present invention.

BEST MODE FOR CARRYING OUT THE INVENTION

Hereinafter, a package and a method of manufacturing the package according to an embodiment of the present invention will be described in greater detail with reference to the accompanying drawings. The related well known functions or constructions that are determined to make the gist of the invention unnecessarily unclear will be excluded from the description of the embodiment. In the drawings, the sizes of the elements may be exaggerated for clarity.

FIG. 3 is a cross sectional view illustrating a package according to an embodiment of the present invention. Referring to FIG. 3, the package includes a sapphire substrate 100, a (LED or semiconductor) patterned layer 110, a first conductive layer 120, an insulating layer 130, a second conductive layer 140, and a third conductive layer 150. Specifically, an LED chip includes the patterned layer 110 and the first conductive layer 120 sequentially formed under the sapphire substrate 100. The insulating layer 130 is formed under the patterned layer 110 to bury the first conductive layer 120. The second conductive layer 140 is formed on a bottom surface of the insulating layer 130, and the third conductive layer 150 is formed in the insulating layer 130 to electrically connect the first conductive layer 120 with the second conductive layer 140. Since the first conductive layer 120 is buried in the insulating layer 130, no void is created unlike the conventional packages. Accordingly, the attachment strength between the LED chip and the insulating layer 130 may be enhanced, thus improving reliability. Hereinafter, a process of manufacturing the package will be described in greater detail.

FIG. 4 is a view illustrating a process of manufacturing a package according to an embodiment of the present invention. Although it is shown in FIG. 4 that the steps including a printing step sequentially are performed in a lower direction, with the chip located top, an actual process proceeds in reverse direction.

Referring to FIG. 4, a chip is prepared, which includes the patterned layer 110 and the first conductive layer 120 sequentially formed on the sapphire substrate 100 (S1). Then, the insulating layer 130 and/or the third conductive layer 150 are formed on the patterned layer 110 and the first conductive layer 120 by a paste or ink printing method, thereby to bury the first conductive layer 120 (S2 and S3).

The order or the number of times of the printing method may be varied depending on the thickness, size, or drawing of a substrate to be formed.

The insulating layer 130 and the third conductive layer 150 may be sequentially formed on the patterned layer 110 and the first conductive layer 120. For example, the insulating layer 130 and the third conductive layer 150 may be formed by sequentially printing a paste- or ink-type insulating material and a paste- or ink-type conductive material on the patterned layer 110 and the first conductive layer 120 (after S2 left, S3), or by sequentially printing a paste- or ink-type conductive material and a paste- or ink-type insulating material on the patterned layer 110 and the first conductive layer 120 (after S2 right, S3). Further, the insulating layer 130 and the third conductive layer 150 may also be simultaneously formed by alternately printing a paste- or ink-type conductive material and a paste- or ink-type insulating material on the patterned layer 110 and the first conductive layer 120, in which case step Si may directly proceed to step S3.

Further, while the insulating layer 130 may be formed by a printing method, the third conductive layer 150 may be formed by a plating method. For example, a paste- or ink-type insulating material is first printed on the patterned layer 110 and the first conductive layer 120 and cured to form the insulating layer 130 (S2 left). Then, an inner portion of the insulating layer 130 is plated to form the third conductive layer 150 (S3). Or, after the third conductive layer 150 is plated on the first conductive layer 120 (S2 right), a paste- or ink-type insulating material is printed on the patterned layer 110 and the first conductive layer 120 and then cured to form the insulating layer 130 (S3).

The paste- or ink-type insulating material may include a filler, a resin, a solvent, a dispersing agent, and an additive agent. After the insulating material is cured, the solvent may be volatilized and the resin may be partially deformed.

The filler may include at least one of Si, Al, AlN, BN, $Al_2O_3$, LTCC ("Low Temperature Cofiered Ceramics"). In addition to the component, the filler may include a paste-type material that includes ceramics, such as BN, $Si_3N_4$, SiC (SiC—BeO), BeO, or CeO, carbon, such as diamond or CNT, and a phosphor. The third conductive layer may include a paste- or ink-type material that includes a metal, such as Ag, Cu, Ti, Ni, Au, Pd, Pt, or Cr. According to an embodiment, the third conductive layer may be formed by plating Ni/Au or Ni/Pd/Au.

In the case where the phosphor is included in the filler, the amount of phosphor contained in a mold resin and an EMC ("Epoxy Mold Component") used for packing the chip together with a sealant may be reduced, thus solving technical problems with attaching properties of mold material or dispersibility of phosphor that may occur since the phosphor is high in content.

The filler is added to increase thermal conductivity and control thermal expansion difference. In the case of ink, the particle size may be in a range from 10 nm to 500 nm, and in the case of paste, the particle size may be in a range from 0.5 μm-100 μm. Each of ink and paste may include a singularity or a plurality of powder. The content of each of ink and paste may be 10 to 97 wt %.

Further, to embed an ESD protection function in the chip-size package, the filler and the resin, respectively, may be metal powder and epoxy resin, or ceramic powder using ion conductivity and epoxy resin. The metal powder may include, for example, Ag, W, Pt, Pd, etc., and the ceramic powder may include ceramic powder using ion conductivity, such as BaAl2O4, ZnS, etc.

Further, when the paste- or ink-type material is cured, a high molecular material may be added for low-temperature curing (more than a room temperature and less than 600 degrees Celsius). The high molecular material may include polyacrylate resin, epoxy resin, phenolic resin, polyamides resin, polyimides rein, unsaturated polyesters resin, polyphenylene ether resin (PPE), polyphenilene oxide resin (PPO), polyphenylene-sulfides resin, cyanate ester resin, benzocyclobutene (BCB), Polyamido-amine Dendrimers (PAMAM), and Polypropylene-imine, Dendrimers (PPI), and PAMAM-OS that is a dendrimer having an inner structure of PAMAM and an outer structure of organo-silicon, alone or in a combination thereof.

A mixing method used for mixing the insulating layer with the high-molecular material may include ball mill, planetary ball mill, impeller mixing, bread mill, or basket mill. According to an embodiment, a solvent and a dispersing agent may be used for uniform dispersion. The solvent may be added for adjustment of viscosity. The concentration of the solvent may be appropriately 3 to 400 Cps for ink and 1000 to 1 million Cps for paste. The solvent may include one or a combination of water, methanol, ethanol, isopropanol, butylcabitol, MEK, toluene, xylene, diethyleneglycol (DEG), formamide (FA), α-terpineol (TP), γ-butylrolactone (BL), methylcellosolve (MCS), and propylmethylcellosolve (PM).

The dispersing agent may include at least one selected from the group consisting of nonionic surfactant, cationic surfactant, anionic surfactant, octyl alcohol, and acrylic polymer.

A silane additive, such as 1-trimethylsilylbut-1-yne-3-ol, allytrimethylsilane, trimethylsilyl methanesulfonate, trimethylsilyl tricholoracetate, methyl trimethylsily-lacetate, trimethylsilyl propionic acid, may be added to increase a bond between particles. However, since addition of the additive may cause gelation, the additive needs to be carefully selected.

The insulating layer and the third conductive layer printed using the above materials are cured. According to an embodiment, a vacuum hardening process may be employed that is performed at a room temperature for 10 to 240 minutes. However, the present invention is not limited thereto.

As a result, no void occurs between the chip and the substrate, and this allows for reliable chip production without occurrence of cracks in subsequent processes.

Thereafter, the second conductive layer is formed on the third conductive layer 150 to be electrically connected to the first conductive layer (S4). Finally, the sapphire substrate 100 is removed by a laser lift-off process, thus completing a chip package.

The invention has been explained above with reference to exemplary embodiments. It will be evident to those skilled in the art that various modifications may be made thereto without departing from the broader spirit and scope of the invention. Further, although the invention has been described in the context its implementation in particular environments and for particular applications, those skilled in the art will recognize that the present invention's usefulness is not limited thereto and that the invention can be beneficially utilized in any number of environments and implementations. The foregoing description and drawings are, accordingly, to be regarded in an illustrative rather than a restrictive sense.

The invention claimed is:

1. A package comprising:
an LED patterned layer on a substrate;
a first conductive layer on the LED patterned layer;
an insulating layer disposed on the LED patterned layer so as to bury the first conductive layer;
a second conductive layer formed to protrude on an outer surface of the insulating layer where the first conductive layer is disposed; and
a third conductive layer connected to the first conductive layer and the second conductive layer from an inner portion of the insulating layer,
wherein a surface of the second conductive layer is in direct physical contact with both the third conductive layer and the insulating layer,
wherein an uppermost surface of the insulating layer is disposed under a lowest surface of the LED patterned layer,
wherein the insulating layer includes a filler, a resin, a dispersing agent, and an additive, and
wherein the filler includes a phosphor.

2. The package of claim 1, wherein the filler or resin is metal powder selected from Ag, W, Pt, and Pd, and epoxy resin, or ceramic powder using ion conductivity and selected from BaAl$_2$O$_4$ or ZnS and epoxy resin, or contains at least one of Si, Al, AlN, Al$_2$O$_3$, BN and LTCC ("Low Temperature Cofired Ceramics").

* * * * *